July 10, 1956 P. WEATHERS 2,754,372

VARIABLE CAPACITY PHONOGRAPH-RECORD PICKUP UNIT

Filed Jan. 17, 1952 2 Sheets-Sheet 1

INVENTOR

Paul Weathers

July 10, 1956 P. WEATHERS 2,754,372

VARIABLE CAPACITY PHONOGRAPH-RECORD PICKUP UNIT

Filed Jan. 17, 1952 2 Sheets-Sheet 2

INVENTOR
Paul Weathers

United States Patent Office 2,754,372

Patented July 10, 1956

2,754,372

VARIABLE CAPACITY PHONOGRAPH-RECORD PICKUP UNIT

Paul Weathers, Haddon Heights, N. J.

Application January 17, 1952, Serial No. 266,897

12 Claims. (Cl. 179—100.41)

The present invention relates to electro-mechanical transducer systems for converting mechanical movement of a control element such as the stylus of a phonograph pickup device, into corresponding variable electric currents or voltages for the control or operation of electrical sound reproducing apparatus and the like.

More particularly, the present invention relates to a type of transducer system as shown, described and claimed in my copending application Ser. No. 241,657, filed August 13, 1951, for High Frequency Modulated Oscillator Transducer System.

In the system referred to, an electron tube oscillator having an anode circuit and a grid circuit adapted to be coupled by the interelectrodal capacities of an oscillator tube to establish and maintain oscillations, is provided with a substantially remote main tuning control or modulating unit having a relatively large tuning inductance element and a relatively small shunt tuning capacitance element providing a frequency control or modulating circuit resonant at a predetermined mean frequency which may be of the order of 20 kc. for example.

A low impedance connection and loose coupling for the grid circuit of the oscillator with the modulating circuit is provided by a low impedance cable connection and an inductive coupling winding of few turns associated with or included in the tuning inductance element.

Furthermore, a tuning inductance is connected serially in the anode circuit and is tunable by distributed capacity and the interelectrodal capacity of the oscillator tube to a frequency slightly higher than the mean frequency of the tuning control or modulating circuit. Modulation of the oscillator is provided by variation of one of the tuning elements and means are provided for deriving modulated signals from the anode circuit.

For adapting the system for the reproduction of phonograph records, the small shunt tuning capacitance element may be utilized as the modulation control element of the system and because of the inherent capabilities of the system, may be provided by two small closely spaced electrodes, one of which is a stylus element for engaging a phonograph record while the other electrode is relatively fixed. The variable capacitor provided by the two spaced electrodes is connected with the main tuning inductance by short leads, and for the reproduction of phonograph records is carried as a unit with the main tuning inductance, by a suitable tone arm which may be pivoted for lateral and vertical movement in a well known manner. The system described may be operated or modulated by any two-electrode or single-sided variable capacitor pickup device without introducing distortion or noise into the output signal. It is a primary object of this invention to provide an improved modulator unit of the variable-capacity type for a high-frequency modulated-oscillator transducer system of the type referred to.

It is also an object of the present invention to provide an improved electromechanical transducer unit of the two-electrode variable capacity tuned-circuit type which is operable to frequency modulate an electronic tube oscillator from a remote point and at relatively high frequencies through a low-impedance single shielded wire circuit connection.

It is a further and important object of this invention, to provide a high-frequency variable-capacity pickup device of improved construction for wide-range high fidelity response and associated circuit elements as a unitary, compact, light-weight structure adapted for tone arm mounting in record changers and the like. With this unit a low-impedance grid circuit connection may be extended thereto through the tone arm from the remainder of a modulated oscillator transducer system of the type described.

It is therefore a further object of this invention, to provide an improved and simplified pickup unit or head of the two-electrode variable capacity type for a high frequency modulated oscillator transducer system which is adapted to be mounted as a unit in a commercial tone arm structure and connected externally for the transmission of signals through a single shielded tone arm conductor having a relatively low impedance.

It is a still further object of this invention, to provide an improved pickup head or modulator unit of the variable capacity type for phonograph record reproduction and the like, wherein the mass of the pickup structure and supporting tone arm may be reduced to a degree to match the compliance of the stylus element and in which the resonance of the stylus assembly can be extended to a frequency substantially above audibility and substantially completely damped.

In any phonograph record reproduction system, the tone arm and pickup device must be relatively light in weight in order to reduce the pressure at the stylus point to a minimum. This is particularly desirable for sound reproduction in modern micro-groove records. With the advent and continuing extensive use of high fidelity micro-groove recordings, a light-weight variable capacity type pickup device, together with a transducer system of the character referred to, is of increasing importance in the record industry.

Obviously, record wear is reduced by low stylus pressure as long as good tracking is maintained. Records having a relatively high amplitude at high frequency wear much faster than those having a constant velocity recording characteristic. Factors which determine record wear are lateral and vertical stylus resonance and stylus mass as well as tone arm resonances. All of the forces resulting from the aforementioned factors determine the minimum tracking pressure, any one of which can effectively limit a further reduction in vertical pressure.

Experience has shown, that most highly perfected magnetic type pickup devices will not track under practical conditions with less than 6 grams of vertical pressure and most of them are operated at 8 grams or over. The mass of the pickup unit itself, combined with the tone arm, further limits reduction in vertical pressure of magnetic pickup devices which are relatively popular at present.

Crystal pickup devices have been reduced in mass to permit tracking pressures down to 5 grams and even lower pressures under ideal conditions, but the compliance of the stylus assembly coupling the record groove to the crystal cannot be reduced much further without reducing the resultant signal output to an impractical level. Also various resonances are inherent in most crystal pickup devices, causing rapid record wear at resonances and deterioration of reproduction quality.

With a practical transducer system as referred to, now available for the use of a small variable capacity type pickup device, the ideal characteristics of such a device as a transducer or modulation control element may be realized. In the transducer unit of the present invention, by utilizing an improved pickup device of that type, the lateral stylus resonance when engaging a record may readily be raised to an ideal value of 17,000 cycles per second or higher. Furthermore vertical stylus resonance of 34,000 cycles per second or higher may readily be realized. The mass of the jewel or stylus point and the mounting means therefor is reduced to a minimum in this improved device. The mass of the tone arm and pickup unit may then be made to resonate with the lateral compliance of the stylus to an ideal value of 20 cycles or lower, and the mass of the tone arm and the pickup unit may be made to resonate with the vertical compliance of the stylus to a frequency of less than 30 cycles per second.

The lateral stylus resonance should be greater than any frequency which it is desired to reproduce such as 17,000 cycles per second or higher as referred to, for full frequency range response, but this resonance must be critically damped. Undamped resonances whether they are higher than the highest record frequencies or not, cause unnatural reproduction from phonograph records and emphasize surface noises. Therefore the ideal pickup device must have all resonances damped so that no significant rise in response shall occur at resonance.

Vertical stylus resonances are highly important in a pickup device which is to operate with low tracking pressures. Vertical resonance of the stylus should be more than twice the highest desired signal frequency to be reproduced that is, in the present example, 34,000 cycles or higher, and this resonance should be damped. This will be understood when it is considered that in a lateral reproducer that is, where the stylus moves laterally, vertical forces act on the point twice per cycle because of the two-sided record grooves, and if resonance occurs at this frequency the point may tend to chatter vertically.

The mass of the stylus point engaging the record should be as low as possible. Often the mounting ring of a jewel stylus point may be heavier than the jewel itself. Microgroove recordings have high frequency accentuation and the forces required from the record to accelerate the stylus point or jewel itself are considerable. Consequently, the ideal pickup device must have a stylus point or jewel with as little mass as possible.

The highest quality pickup devices now known often cause too much side wall flexing of record grooves above 10,000 cycles per second when a relatively sharp tip radius is used, thereby causing excessive record wear in areas having considerable energy above that frequency. By reducing the sapphire or stylus point dimensions to the order of .015 in diameter shank and the length to .025", as is possible in a two-electrode variable-capacity type pickup in accordance with the present invention, the jewel or stylus point itself causes practically no side wall deformation under 20,000 cycles per second. A diamond point when used, must have even smaller dimensions than a sapphire type jewel point, due to its greater density.

Tone arm resonances may be corrected by strategically applying damping blocks or by using enough mass in the tone arm whereby its resonance with the compliance of the pickup stylus assembly occurs below the lowest recorded frequency. Tone arm resonances due to higher modes of resonance can best be corrected by reducing the excitation from the record, which means increasing the compliance of the stylus assembly. This is readily obtainable by the variable capacity pickup of the present invention. Likewise resonance of the tone arm with the vertical compliance of the stylus assembly may be well damped in this device, otherwise poor tracking will result from vibration of the phonograph turntable and record.

From the foregoing considerations, it will be seen that a further object of this invention is to provide an improved two-electrode variable capacity pickup unit for the high fidelity reproduction of phonograph records of the micro-groove and similar types which may have a highly compliant stylus with a lateral highly damped resonance point above the highest sound frequency to be reproduced and having a stylus structure or assembly with a maximum stiffness and minimum mass whereby the stylus length may be sufficiently great to provide the desired compliance. In accordance with this object of the invention the damping is so applied that a minimum of energy is absorbed except at frequencies near the stylus resonance and the damping is effective for both the vertical and horizontal vibrational modes of the stylus assembly.

To obtain a resonance of 17,000 cycles per second or higher for a pickup device, it is necessary to have maximum stiffness with the minimum mass in the stylus assembly as noted above, otherwise the length of the stylus becomes so short that its compliance cannot be made great enough. Consequently, in accordance with the invention, a tubular stylus structure is provided and aluminum alloy is preferred as the material. Two flat hinges integral with the stylus are provided at the rear end of the stylus comprising a first vertical hinge for lateral compliance and a second horizontal hinge for vertical compliance with the rear end of the stylus element rigidly secured to the body of the pickup device of a fixed element thereof. The damping material is located and proportioned such that it damps both the vertical as well as the horizontal vibrational modes of the stylus assembly. In one embodiment of the invention, it may comprise a block of viscous material engaging the flattened hinge portions of the stylus and the pickup structure at the point of engagement with the stylus. With this arrangement, damping is applied so that little energy is absorbed by the damping block except at near resonance.

While the tone arm for use of this type of pickup device is made as light as possible, it must be so proportioned that it may resonate with the stylus compliance below 20 cycles per second, or the lower reproduction limit desired in any case. With a suitable light tone arm and with a pickup unit constructed in accordance with the invention, it has been found that a stylus point pressure of 5 grams or less may be obtained. With a low mass tone arm the stability under vibration is then relatively high, as is attested by the fact that a turntable with a pickup unit of the type above referred to may be jarred heavily without causing the pickup stylus to jump grooves.

While counter-balancing of the tone arm may be provided to further reduce the stylus pressure, and while a pressure of one gram may so be achieved without jumping of the record grooves by the stylus point, the results are on a par with a good magnetic pickup working at 8 grams when the turntable is jarred. Accordingly, the counter-balancing of the tone arm was not considered effectual in an ideal system in accordance with the present invention.

It is therefore, a further object of this invention, to provide an improved high frequency modulator unit of the variable capacity type for phonograph record reproduction and the like, which may be mounted on a suitable tone arm and operated at less than a minimum stylus pressure heretofore considered practical, such as 1 gram for example, without resorting to the expedient of tone arm counter-balancing.

It is a further and related object of this invention to provide an improved high frequency modulator unit of the variable capacity type having a highly compliant stylus element and supplementary resilient stabilizing and supporting means operable adjacent to and in the plane of the stylus point for further reducing the operating stylus pressure to a minimum such as one gram for example.

In carrying out the foregoing objects of the invention a resilient support structure or device is placed on, or fixed to, the pickup head and arranged to resiliently engage the record surface adjacent to the pane of the stylus point and preferably on the same tone arm radius therewith so that it is a few grooves in advance of the stylus point. The resilient support provides a relatively large area of contact with the record surface in operation, and comprises a plurality of parallel flexible reed-like elements or laminations. In one embodiment of the invention it may be in the form of a multiple number of stiff brush bristles or hairs to form a relatively short flexible brush structure attached relatively flexibly to the pickup body and so proportioned that it effectively reduces the vertical pressure on the record surface of the stylus from 4 to 5 grams to approximately one gram or any desired value. The multiple element, flexible, or resilient supporting structure is so designed that the stylus controls the lateral feed across the record. The total combined area of contact of the bristles or individual flexible elements in the supporting structure is sufficiently great to make the unit pressure on the record exceedingly small.

The action of the resilient supporting device damps both lateral and vertical swinging tone arm resonance, and additionally cleans the record ahead of the stylus when constructed of hair-like bristles of proper material. It has been found that by the pickup unit, so damped and controlled in stylus pressure, rumble from the motor drive elements of a phonograph record reproduction system may be substantially eliminated as well as acoustic feedback from any associated loudspeaker. The dimension of the individual flexible elements of the multiple support structure are so chosen that the individual elements do not effectively engage the grooves to act as lead-in devices but ride along the record surface wholly as resilient supporting and damping means directly adjacent to the stylus point. It has been found that a pickup as described, in accordance with the invention, will thus track even a 78 R. P. M. shellac record at one gram stylus pressure and not jump a groove even when operating in a moving vehicle.

In a presently preferred embodiment of the invention, the resilient supporting device, the stylus, the fixed electrode and a stylus guard element extend downwardly and forwardly from the bottom of the pickup unit. The fixed electrode and the stylus guard are slightly spaced from the record surface while the stylus and flexible supporting structure engage the record surface in the same plane and are substantially on the same tone arm radius.

The resilient supporting structure takes a major portion of the weight at the free end of the tone arm resulting from the pivoted tone arm and associated pickup unit so that a minimum desired pressure is applied to the stylus point itself. The tone arm is also highly stabilized both laterally and vertically by the flexible or resilient supporting structure. Due however to the wide area of contact of the multiple elements and to the size of the individual elements, the tone arm is at all times under the lateral control of the stylus which follows the grooves and gives full fidelity of response due to its high degree of compliance relative to the mass of the tone arm and pickup structure. The associated stylus body and tuning inductance windings associated with the variable capacity electrodes, are of relatively low mass, and the single flexible connection at the rear of the pickup unit adds no appreciable weight to the tone arm structure used to support the unit.

In accordance with the invention furthermore, the pickup device and associated tuning inductance elements are adapted to be constructed and carried by a tone arm as a highly compact and lightweight pickup unit. The unit provides full modulation control for a high-frequency modulated oscillator transducer system of the type hereinbefore referred to and requires only a single-conductor low-impedance cable connection to the oscillator portion of the system. This may extend from the unit to any convenient distance such as four feet.

The invention will however be further understood from the following description of certain presently preferred embodiments thereof, and is set forth with particularity in the appended claims. Furthermore, the invention both as to its organization and method of operation, as well as additional objects and advantages thereof, will likewise be understood from the following description and reference to the accompanying drawings in which:

Figures 1, 2:
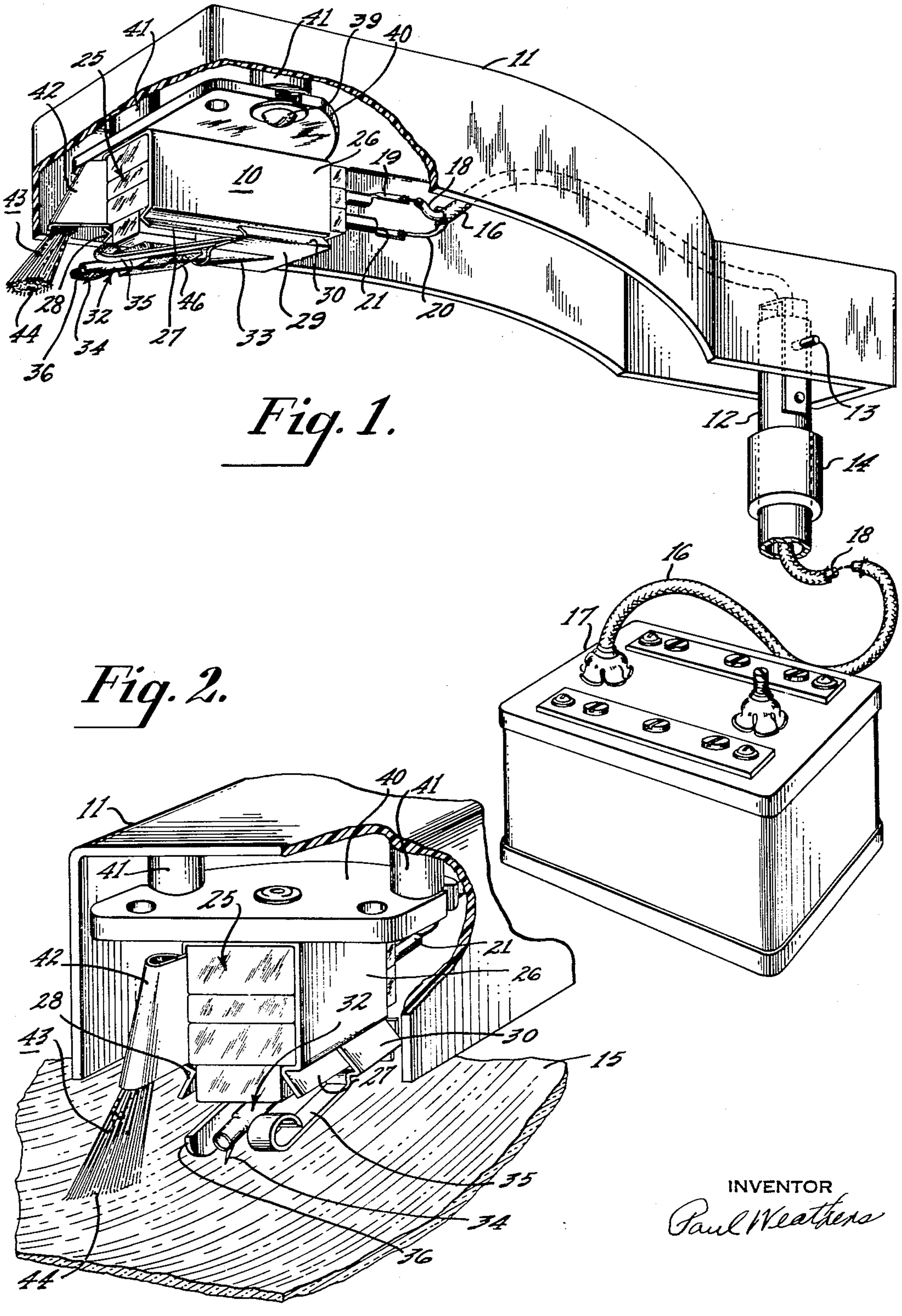
Figure 1 is a view in perspective and on a greatly enlarged scale, of a variable-capacity pickup unit embodying the invention with a portion of a supporting tone arm structure broken away to show the details of construction, and with a modulated oscillator unit connected therewith in accordance with the invention.
Figure 2 is an end view in perspective and on a somewhat larger scale, of the pickup unit of Figure 1 in operative relation to a surface of a phonograph record, and with a fragmentary portion of the tone arm structure broken away to disclose further details of construction of the unit.

Referring to the drawings in which like elements throughout are designated by like reference characters, and with particular reference to Figures 1 and 2, a variable capacity phonograph pickup unit 10 is mounted in the forward or free end of a lightweight hollow tone arm 11 which is pivoted at its rear end on a suitable hollow supporting stud 12 to rotate about a horizontal pivot axis provided by a pin 13 and a vertical pivot axis provided by a sleeve 14. The tone arm and pivotal mounting represents any light weight freely movable tone arm construction for supporting the pickup device and permitting it to be lifted to move transversely across the surface of a record indicated at 15 (Figure 2).

The hollow interior of the tone arm provides a protective enclosure for the pickup device and a suitable space for a shielded signal output conductor or cable 16 extending through the tone arm and the hollow supporting stud 12 to an oscillator unit 17 at an external point, the cable 16 being adapted to plug into the oscillator unit as indicated.

The conductor or cable 16 is a single conductor shielded cable comprising an inner insulated conductor 18 connected with a slip-on terminal connector 19 for the pickup unit 10, and an outer braided conductive shield having a connection 20 with a second slip-on terminal connector 21 for the pickup unit.

The pickup unit is of relatively small, light-weight construction, comprising an elongated insulating body portion 25 of rectangular cross section. This may be of laminated construction as indicated, or molded in one piece if desired, and may be of suitable insulating material preferably of light-weight. The insulating body is tightly fitted into an elongated open-ended shield casing 26 of conductive material. In the present example the casing is formed of thin-walled conductive sheet material substantially closed around the insulating body of the pickup and having two lower edges 27 and 28 which are crimped into the insulating body and provide two parallel outer grooves adapted to receive a detachable bottom closure or stylus plate 29 with a sliding fit. In the present example, the plate 29 is provided at its sides with inturned flanged edges 30, of which one appears in Figure 1, to engage the grooves in the edges 27 and 28 of the casing 26.

A light-weight tubular stylus 32 depends forwardly from the body of the pickup unit with an anchored connection at its inner or rear end on the cover plate 29. The latter is formed centrally with a groove 33 to receive the inner or rear end of the stylus at such an angle that the stylus may extend forwardly and downwardly toward the record surface as shown in Figure 2 while being substantially straight from end to end. The forward end of the stylus is provided with a sapphire tip 34 which is set into the stylus at an angle to properly track a record groove.

The stylus extends substantially centrally of the pickup body in a forward and downward direction to a position somewhat in advance of the stylus body and is located between a stylus guard 35 and a fixed electrode 36. The stylus guard extends from the plate 29 to a position in line with and on substantially the same radius of the tone arm as the stylus point in the present example. The guard is formed integrally with the bottom plate as a thin strip extension thereof having a curled end.

On the opposite side of the stylus the fixed electrode 36 also depends from the insulated body of the pickup unit forwardly and downwardly adjacent to and along the stylus, and is sufficiently closely spaced with respect to the stylus along a considerable portion of a length that it may operate with the stylus as a small two-electrode variable capacitor or variable capacity modulator device.

The pickup unit is provided with a suitable mounting plate 40 secured to the casing 26 and having suitable recesses or notches for mounting on studs 41 in the tone arm by fastening screws 39, one of which is shown in Figure 1. By means of the mounting plate 40 the pickup unit may be adapted for any suitable tone arm, that shown being a standard mounting for presently available 45 R. P. M. record changers.

Extending forwardly from the insulating body of the pickup unit is a bracket 42 preferably of thin sheet metal, which fits at its inner end between the body 25 and the inner surface of the adjacent wall of the shield casing 26 to be clamped thereby and held firmly. The outer end of the bracket is formed in any suitable manner to receive and hold a plurality of flexible supporting elements such as relatively short, stiff brush bristles as a composite resilient unit 43, the lower end 44 of which when in contact with a record surface, lies in the same plane as the stylus point 34 with the flexible elements under stress to support the weight of the tone arm and pickup unit which bears downwardly from the pivot axis 13. This pressure is normally such that the stylus pressure may not be reduced to a desired minimum even with a very light weight tone arm structure and pickup unit. It is possible with the resilient supporting element substantially on the same radius with the pickup stylus point not only to reduce the stylus pressure to a desired minimum but also to stabilize the entire operation of the pickup device both laterally and vertically and will hereinafter further be described.

At the rear or inner end of the stylus substantially adjacent to the frontal edge of the groove 33 in the bottom plate 29, a block of viscous damping material 46 is mounted on and in contact with the stylus while contacting or joining with the plate 29 at its rear or inner end. Further constructional features and mode of operation of the damping means will hereinafter be described.

Figure 3:
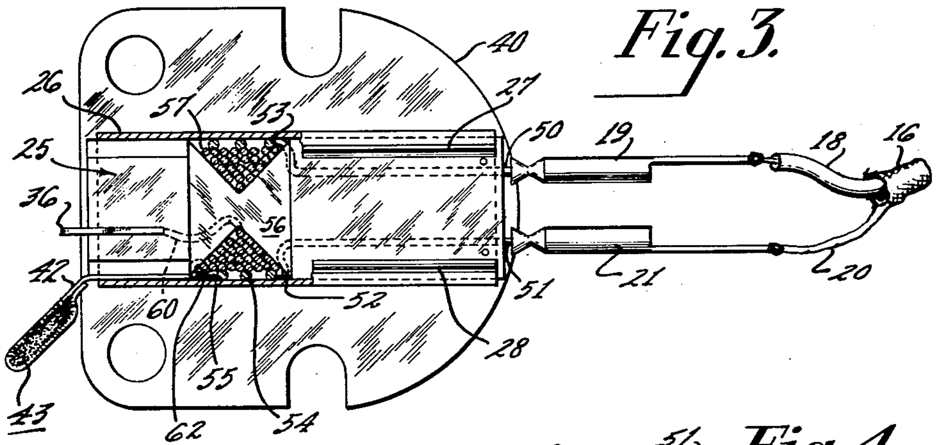
Figure 3 is a bottom view of the pickup unit of Figures 1 and 2, partly in section and on the same scale as Figure 2, with a portion removed to show details of certain electrical components thereof and further structural features.
Figures 4, 5:
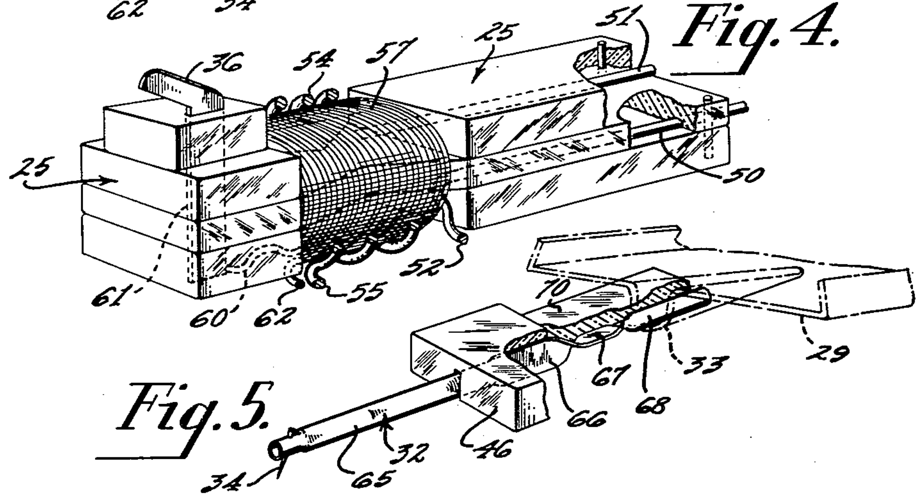
Figure 4 is a view in perspective, partly in section and partly broken away, of the interior body portion of the pickup unit of Figures 1, 2 and 3 showing further details of the electrical components thereof, and being on a further enlarged scale.
Figure 5 is a view in perspective, partly in section and partly broken away, showing structural details of the stylus and the mounting means therefor on a greatly enlarged scale.

Referring now to Figures 3 and 4 along with Figures 1 and 2, it will be seen that the terminal connectors 19 and 21 for the cable 16 are connected respectively with conductive terminal rods 50 and 51 extending outwardly at the rear end of insulating body 25, for engagement with the connectors. The terminal rods extend inwardly through the body in parallel relation to connect with other electrical components. The rod 51 connects with the casing wall at 52 and the rod 50 connects to one end 53 of a three-turn coupling winding 54, the opposite end of which is connected to the casing as indicated at 55. The casing provides a common ground connection for the unit and is connected to the ground side of the system in operation.

Intermediate between the ends of the insulating body it is provided with a bobbin or winding section 56 of reduced V-shaped cross section to receive the three-turn winding 54 and a multiple turn winding 57 directly adjacent to the three-turn winding and filling the V-shaped bobbin portion of the insulating body. Both windings therefore lie between the confines of the shielded casing with the multiple turn winding spaced therefrom by the three-turn winding as shown more particularly in Figure 3.

The inner terminal lead 60 of the multiple turn winding passes through the insulating body and is connected directly to the fixed electrode 36 of the variable capacity element of the pickup unit. The latter electrode is a flat plate of conductive material such as copper, having an integral portion 61 embedded in the insulating body, and to the upper or inner end of which the winding 57 is connected. The outer end or lead of the multiple winding 57 is connected as indicated at 62 directly to the casing 26 or ground substantially adjacent to the connection 55 for the outer winding.

Both windings 54 and 57 are insulated conductors or wires, the conductor of the inner winding being of relatively smaller cross section to provide a relatively large number of turns in the small space afforded by the bobbin area of the pickup body. The outer winding is of relatively low impedance and the conductor is of relatively large cross section to provide a low resistance to current flow. In the present example, the inner winding may be considered to have substantially 110 turns for tuning with the capacity provided by the electrodes 32 and 36, plus distributed capacity of the winding and leads, to a frequency of the order of 20 mc.

It will be noted in Figure 3, that the bottom or stylus plate is removed to show the interior construction of the pickup unit and that the grooved edges of the casing are cut away to show the coil construction and arrangement. Similarly, in Figure 4, the outer three-turn winding is cut away and the insulating body of the pickup unit is removed from the casing to show its construction more completely. The structure shown represents a presently preferred embodiment of the invention. However, the insulating body may be wholly cast as a unitary structure rather than be formed of laminations as indicated, and the body may, in accordance with the invention, be shaped other than rectangular in cross section, depending on manufacturing facilities and processes available. In any case, the winding 57 and the three-turn coupling winding 54 are provided directly on or in the pickup body and directly in rear of the fixed electrode of the variable capacity elements in order to provide relative short connection leads. Furthermore, the materials used to construct the pickup unit are preferably as light as possible in order to reduce the weight at the stylus point.

Referring now to Figure 5 along with Figures 1 and 2, further details of the stylus element may be considered. It will be noted that the light-weight cylindrical form of the stylus at its forward or free end is continued rearwardly a short distance when it is slightly flattened to form a flat tubular beam section 65 which extends into the forward edge of the damping body or block 46, and that between this point and the supporting edge of the stylus groove 33 in the bottom plate 29, two flat hinge portions 66 and 67 of short length are formed integrally with the stylus by completely flattening the tubular structure at these points substantially at a right angle one with respect to the other. The first flat hinge section 66 is in a vertical plane when the pickup is in use and the second hinge section 67 is substantially at a right angle thereto, in a horizontal plane. The tang or rear end 68 of the stylus may be cylindrical in form and extends into and is soldered or secured to the bottom of the groove 33. It is thus joined firmly with the bottom plate 29 whereby it is rigidly anchored to the pickup body. At the same time it is readily removable with the bottom plate for inspection.

It will be noted that the damping block body 46 is slotted and lies substantially astride the vertically flattened hinge section 66 of the stylus. It is further provided with an integral rear portion 70 which extends over the horizontal flat hinge section 67 and into engagement with the fixed bottom plate 29 of the casing. Thus the damping block body is not only anchored to the stylus over the flat hinge portions thereof, but it is also anchored to the pickup unit casing.

The damping means is thus coupled to the beam part of the stylus by coupling this part of the stylus to comparatively large flat integral hinges provided by the flat portions 66 and 67 for lateral and vertical compliance respectively. The damping means is then applied to the hinges so that the mass of the damping material is not added to the active part of the stylus. In other words, the active or beam portion of the stylus is free to vibrate and only when the stylus attempts to move in an undesirable mode does the damping exert its effect.

It will be seen that by providing a stylus element or stylus of substantially straight rod-like construction preferably tubular, to provide strength and rigidity with reduced weight, compliance may be controlled and provided at the flat hinge sections within the body of the damping material where it is most effective for reducing undesired resonances. While the mass of the stylus assembly is reduced, the length of the active part of the stylus may be such that its lateral resonance will be well above the highest frequency which is to be reproduced and this resonance is completely damped.

The thin-walled, exceedingly light-weight stylus is particularly advantageous in the reproduction of higher audio frequencies, due to the rapid acceleration of the stylus alone, which produces instantaneous forces many times those at lower frequencies, and to further reduce the stylus mass at a point where it is most effective, the jewel or stylus point 34 without any additional means, passes through the walls of the tubular stylus and is cemented in place with a minimum of cement. With this stylus construction, the overall mass which is accelerated by the record modulation is of the order of $\frac{1}{10}$ of that of conventional pickup devices and is such that the stylus may track any record groove at a pressure of one gram or less. The resonance of the compliance of the mass of the present stylus even with a .001″ radius point occurs far above audibility even at one gram of vertical pressure. In conventional type pickup devices, excessive groove wall deflection occurs at frequencies over 12,000 cycles and the conventional stylus literally stands still for high velocity recordings above 12,000 cycles. This causes excessive wear of the record groove.

Conventional pickup devices generally modify the record noise when reproducing with a conventional microgroove .001″ stylus point. Part of this modification of the record noise is due to the above noted flexing of the record groove walls under the force due to the acceleration of the jewel or stylus point and the stylus assembly. Further modification of the noise results in most conventional pickup devices because of resonance in the stylus assembly itself within the range of audibility, and because of lack of adequate damping. This is readily apparent from the fact that noise from such pickup devices in the reproduced sound appears to have a definite pitch. With the stylus and pickup structure of the present example in accordance with the invention, such characteristics are avoided. Wide frequency range of response is provided, free of resonances. The sound output is more pleasant and natural and less disturbance is caused by the presence of any ticks and surface noises in the record material.

The present practice of limiting the frequency response to reduce noise often produces a disagreeable effect which is more audible than the original noise although the modified noise results are less evident with instruments than by listening tests. This result is produced oftentimes by a response in which the cut-off is sharpened by resonant circuits or resonant loudspeakers. The noise assumes the frequency of the cut-off and constantly includes itself in the reproduced sound in an objectionable manner. A system of sound reproduction such as is possible with the pickup unit of the present invention which has good response will cause less attention to noise ticks and surface noises which may be present in the reproduced material and listening tests have proven that noise is not as noticeable when it does not assume a definite pitch.

Further considering the stylus structure of Figure 5 it should be noted that while in actual construction the stylus is of an overall length of less than $\frac{3}{8}$″ and preferably of aluminum tubing having a .001″ wall and a .020″ diameter, and while the lateral and vertical compliance is practically frictionless and free, the stylus is protected against damage by the fact that it will completely retract within the protective limits of the stylus guard 35 when pressure in excess of 5 grams is applied to the stylus point. The low tone arm mass requires lateral compliance far in excess of any conventional practice in order to have the tone arm substantially stand still while reproducing the lowest frequencies which may be recorded and this ideal is attained with the present structure.

It is further pointed out that the resilient supporting structure adjacent to the pickup stylus, which is presently provided by the forwardly extending large area brush unit, is so proportioned that it reduces the stylus pressure on the record from substantially 4 grams to approximately 1 gram. As hereinbefore mentioned, the area of contact of the flexible support is sufficiently large that the unit pressure of each flexible element on the record is exceedingly small and the stylus controls the lateral feed of the tone arm across the record. The resilient supporting structure for the pickup unit assists in damping both the lateral and swinging tone arm resonance. As may be seen from Figure 2, the resilient support engages the record surface a few grooves in advance of the stylus point and absorbs the excess weight of the tone arm and pickup unit. At the same time it operates to strip any dust off the record which is ahead of the stylus. It has been noted that this action causes the dust to collect and to drop off the brush when the pickup is raised from the record.

Figure 6:
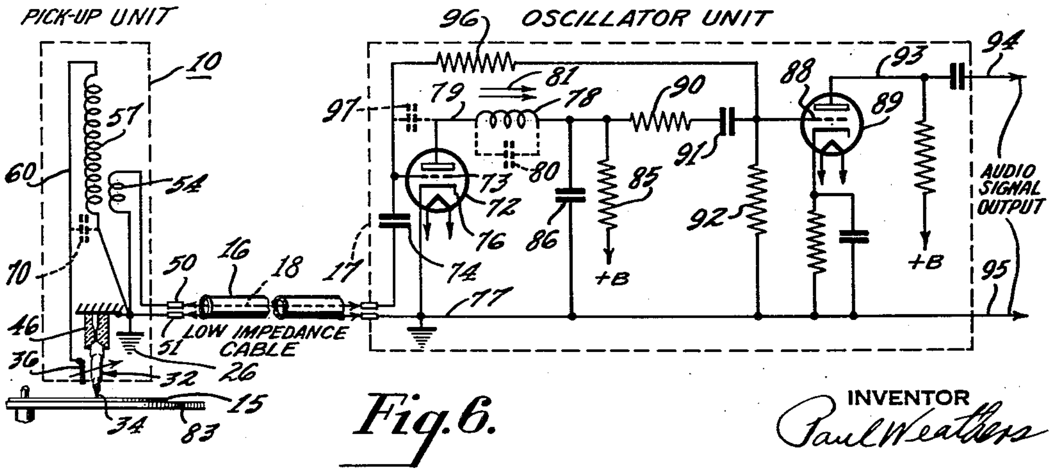
Figure 6 is a schematic circuit diagram of the pickup unit of Figure 1 and its associated and connected oscillator unit in accordance with the invention.

Considering now the schematic circuit diagram of Figure 6, it will be seen that in the pickup unit 10, the winding 57 provides a main tuning inductance, one lead or end of which is connected to the casing ground 26 and thence to the grounded stylus 32, while the opposite lead or end is connected through the lead 60 to the fixed electrode 36. The distributed capacity of the winding 57 and of the leads is indicated by the capacitor 70, which, with the variable capacity provided by the stylus and the fixed electrode, is connected directly across the winding 57 to provide a tuned high frequency control or modulating circuit.

The three-turn winding 54 which may be of more or less turns of that order, is connected likewise at one end to the casing ground 26 and the output terminal 51 of the unit, while the opposite end or lead of the winding 54 is connected to the output terminal 50.

A modulated oscillator incorporating this type of control or modulator unit as hereinbefore referred to is shown schematically further in the circuit of Figure 6 and is that apparatus which is indicated as being within the casing 17 of Figure 1. This includes a high mu triode oscillator tube 72 having a control grid 73 coupled through a grid coupling capacitor 74 and the central insulated conductor 18 of the low impedance cable 16, with the winding 54, which is a coupling winding or coil for the grid circuit of the oscillator with the pickup unit.

The cathode 76 of the oscillator tube 72 is connected through a grounded lead 77 to the cable shield and thence to the grounded side of the coupling winding 54, whereby this coupling winding is included in the grid circuit of the tube 72. The low impedance grid circuit thus provided is loosely coupled to the winding 57 which is the main tuning inductance of the system, and this together with the variable capacity provided by the electrodes 32—36 plus the distributed capacitance 70, tunes the control or modulator circuit provided by the inductive and capacitive circuit elements 57 and 32—36, to a mean resonant frequency of the order of 20 mc. This resonant frequency is varied by movement of the stylus 32 as by the record groove modulation to a maximum of substantially 100 kc.

From the foregoing consideration of the circuit it will be seen that the control grid 73 of the oscillator tube 72 operates directly from very low impedance of the coupling winding 54, and it would appear that the circuit could not be made to oscillate. However, by inserting a tuned inductance 78 serially in the anode circuit 79 of the oscillator tube 72, and with the resonance of the inductance 78 adjusted by a suitable movable core element or the like as indicated by the arrows 81, to a resonant frequency slightly higher than that of the control or modulator circuit in which the inductance 57 is connected, steady state oscillation takes place at approximately the resonant frequency of the inductance 57 and its associated capacitances. The inductance 78 is tuned by the distributed winding capacitance and associated circuit capacitance, represented by the dotted capacitor 80 connected directly in shunt therewith.

During record reproduction, the operation of the pickup unit results in frequency modulation of the oscillator unit. This in turn produces a corresponding modulation in the amplitude of the oscillation because of the circuit properties. Simultaneous rectification of the high frequency R.-F. signal produces an audio frequency voltage output signal across an output coupling impedance or resistor 85 connected serially in the anode circuit with the tuning inductance 78. The impedance 85 is suitably bypassed for the oscillator frequency by a bypass capacitor 86 connected to the ground lead 77. This audio frequency voltage corresponds very exactly to the motion of the pickup stylus.

The audio frequency signal is coupled to the grid 88 of an audio frequency amplifier tube 89 through a coupling resistor 90 and a coupling capacitor 91 across a grid resistor 92. The series coupling resistor acts to filter out the oscillator signal frequencies. The resultant amplified signal is derived from the output circuit 93 of the amplifier 89 through suitable output leads 94 and 95 which may be connected to suitable sound amplifying and reproducing equipment (not shown).

The grid of the oscillator is connected through a grid resistor 96 to the grid of the amplifier tube 89 and thence to ground through resistor 92 so that feedback is applied to the oscillator grid for actuating certain frequencies.

It will also be noted that the interelectrodal capacity between the oscillator anode and grid is indicated by the dotted capacitor 97. It is through this capacity that oscillations are maintained by feedback from the anode circuit to the low impedance grid circuit constituted by the low impedance cable connection and the low impedance coupling winding 54. As the further operation of the system does not concern the invention, no further description of the oscillator unit is believed to be necessary. However, it may be pointed out that the low impedance cable connection which in the present example extends through the tone arm as shown in Figure 1, to the external oscillator and amplifier unit 17, may be extended to any convenient length and may be provided by a standard single conductor shielded cable commonly used with crystal or magnetic phonograph pickups.

Also with a pickup unit as shown and described, in connection with the oscillator unit as outlined in connection with Figure 6, an audio frequency output has been obtained of the order of 5 volts at 1000 cycles per second and a frequency response substantially constant in amplitude from 35 to 15,000 cycles per second with a slight rise below and above the limits mentioned. The overall frequency response is therefore substantially distortionless between 20 and 20,000 cycles per second.

In addition, the removal of all mechanical resonances from the range of stability in the pickup unit results in improved high fidelity sound from micro-groove records as good as from original tape masters. The low mechanical forces required of the record to actuate the stylus with its relatively low vertical pressure and high degree of compliance extends record life many times, and the low pressure on the stylus point furthermore extends the life of sapphires substantially indefinitely.

The noise response from the pickup unit described resulting from dust particles, scratches or general surface defects on records, is of such broad band character that it does not create attention when listened to and the transient response is so excellent that sharp wave fronts from noise ticks are of extremely short duration. There are no resonances in the pickup structure to be excited to cause ringing or further spurious responses.

It has been found that the pickup unit shown and described will track a vertical-cut record with practically no response. However, the construction may be modified for operation of the unit in response to vertical-cut records while eliminating response to lateral variations.

With the pickup structure shown and described, the side walls of the record groove move the stylus rather than flexing under the pressure of the stylus and thus more high frequency accentuation in the reproducing equipment with accompanying surface noise than heretofore has been possible.

The desirable result is attained by a construction which, contrary to presently accepted thought, provides that for any possible lateral resonances in the stylus assembly within the desired frequency range or vertical resonances within a frequency range of substantially double the response range desired, the stylus assembly is completely damped.

The damping is applied in such a manner and by such means that both the vertical as well as the horizontal modes of the stylus assembly are completely damped while the damping absorbs little energy below resonance.

Furthermore, to permit the stylus assembly to resonate above audibility or in the region of 20 kc. and still have sufficient surface to produce an appreciable capacity change in the two electrode pickup structure, a straight thin-walled tubular stylus is provided as has been described. This provides low mass, high stiffness and maximum working area for capacity change, and conforms to the requirement that to obtain a resonance in the stylus element of 17,000 cycles per second or higher, it is necessary to have the maximum stiffness with minimum mass, otherwise the length of the stylus becomes so short that its compliance cannot be made great enough.

Consequently a straight stiff tubular structure is provided in accordance with the invention, preferably of aluminum alloy and with the flat hinge sections in prolongation of the stylus along its axis and with a further rear section in the same axis secured to an abutment such as the frame of the pickup unit. The damping is then effectively located between the abutment and the pickup stylus along the two hinge sections, which are relatively short with respect to the beam section of the stylus. The result is an ultra low mass and efficient variable capacity stylus having maximum compliance and maximum useful frequency response range.

The capacity change is somewhat improved or increased by the fact that the stylus is partially flattened as has been described, in the beam portion thereof between the sapphire point and the first or vertical hinge section. Furthermore, the mass of the stylus point is reduced to that which is provided merely by the sapphire itself, since the sapphire is effectively thrust through the end of the stylus tube and secured by a minimum of cement. Thus it is wholly without any holding ring or other means normally used, for such tips in commercial practice. This conforms then with the highly desirable objective for having the mass of the stylus point engaging a record to be as low as possible, thereby to prevent wide wall flexing of the record grooves above a frequency such as 10,000 cycles per second as hereinbefore referred to.

The pickup unit of the present invention further eliminates the necessity for counter-balancing the tone arm or other pivotal supporting means therefor. Counter-balancing has been found to be ineffectual to prevent the jumping of grooves at certain higher frequencies and the mass of the counter-balancing means tends to hold the tone arm against movement vertically and therefore unduly increases the pressure on the stylus periodically.

By means of the resilient multiple element support connected with the pickup unit directly adjacent to the stylus point and operative to receive the pressure of the tone arm of the pickup unit, the stylus pressure is not only relieved but the operation of the unit is laterally and vertically stabilized for improved frequency response. The multiple bristle brush unit of the present example provides resilient support and a relatively large area in engagement with the record surface in the plane of the stylus. It is obvious however that other multiple element flexible supporting means may be provided for this purpose.

However, the structure shown and described herein is presently preferred for this purpose in that it not only effectively provides a resilient support for the free end of the tone arm and the pickup unit, but it also does not injure or affect the record surface in any way except beneficially, in that it also has the properties of a brush for removing dirt and dust from the record in advance of the needle, although this is but an incidental result where a multiple number of bristles are provided as the flexible supporting elements of the structure.

The pickup unit of the present invention provides an ultra low mass capacity-type stylus and effective means for translating the movements of the stylus into electrical signals or tuned circuit variations which can effectively be amplified and reproduced through a high frequency modulated oscillator of the type described. The modulation type of transducer is preferred as the groove of the record merely has to move the stylus back and forth against its compliance. It is therefore superior to any generator type of pickup device which requires the record to do the work of generating a signal voltage. Thus in the present system, the capacity variation between the stylus and a single other fixed capacity electrode operates to change the resonance of a closely associated tuned high frequency circuit to produce modulation of an oscillator which is loosely coupled with this tuned circuit.

What is claimed is:

1. A variable capacity phonograph pickup unit adapted to be mounted on a tone arm and comprising a supporting structure, a depending movable stylus element carried by said structure and having a high degree of compliance and a high degree of damping, means carried by said stylus element for engaging and tracking a record groove, an electrode element spaced from said stylus element to provide therewith variable capacity means responsive to phonograph record groove modulation, a high frequency inductive winding in said pickup unit adjacent to and directly connected with said stylus and electrode elements to provide therewith a tunable high frequency circuit within the pickup unit having high impedance and low distributed capacity, and means providing a low-impedance loose-coupled output connection with said high-frequency circuit.

2. A variable capacity pickup unit for a high frequency modulator oscillator transducer system, comprising a supporting structure, a straight tubular stylus depending from said structure, said stylus having a high degree of compliance provided by an integral flat section adjacent one end thereof and a high degree of damping provided by a body of damping material engaging and surrounding said section, said stylus further having a rigid beam portion of minimum mass and maximum stiffness, a flexible multiple element support depending from said pickup unit adjacent to said stylus and terminating substantially in and at an angle to the plane of the stylus point, said support being flexible to a degree for damping undesired resonances in said supporting structure and resiliently reducing the stylus pressure, an electrodal element spaced from the beam portion of said stylus to provide therewith variable capacity means responsive to phonograph record groove modulation, a high frequency inductive winding in said pickup unit connected with said stylus and said electrodal element to provide therewith a tunable high frequency circuit, and means providing a low-impedance loose-coupled output connection with said tunable high frequency circuit.

3. A variable capacity pickup unit for a high frequency modulated oscillator transducer system, comprising an insulating body, a shield casing partially enclosing said body, a movable stylus extending downwardly from a portion of said shield casing, a fixed insulated electrode depending from said body in spaced relation to said stylus to provide therewith a variable capacity modulating element for said unit, a high frequency tuning winding connected with the stylus and the fixed electrode to provide therewith a variably tunable high-frequency modulating circuit within the pickup unit, a low impedance output winding of relatively few turns inductively loosely coupled with said tuning winding, and means providing an output connection with said output winding.

4. A variable capacity pickup unit as defined in claim 3, wherein a depending multiple-element brush device is connected at an upper end with said casing and body and has a flexible elongated lower free end at an angle to and providing a relatively large area of contact with a record surface substantially in the plane of the stylus point for resiliently controlling the stylus pressure on said surface and for damping the resonances of a supporting tone arm structure in operation.

5. In a phonograph record reproducing apparatus, a pivotally mounted tone arm structure having a free end adapted to move laterally and vertically with respect to a record surface, said tone arm structure being of relatively light weight, a variable capacity pickup unit, means for mounting said unit in the free end of said tone arm structure to move therewith, said unit including a depending movable stylus element mounted at one end in said unit, means carried by said stylus element for engaging and tracking a record groove, fixed electrodal means adjacent to said stylus element providing therewith variable capacity means responsive to modulation movement of said stylus, a high frequency tuning winding carried by said unit and directly connected with said variable capacity means, and a low impedance output winding of relatively few turns inductively loosely coupled with said tuning winding.

6. In a phonograph record reproducing apparatus, a pivotally mounted tone arm structure, a variable capacity pickup unit mounted in the free end of said tone arm structure to move therewith, a downwardly extending movable stylus for said unit, means providing a high degree of compliance and a high degree of damping for said stylus, said stylus further having a rigid beam portion of relatively low mass, a flexible multiple-element brush-like support depending from said pickup unit adjacent to said stylus and terminating at an angle to and substantially in the plane of the stylus point for resiliently engaging a record surface to effect damping of said tone arm structure and to reduce the stylus pressure, an electrodal element spaced from the beam portion of said stylus to provide therewith variable capacity means responsive to phonograph record groove modulation, a high-frequency inductive winding for said pickup unit directly connected with said stylus and said electrode to provide therewith a tunable high frequency circuit, and means providing a low impedance loose-coupling output connection with said tunable high-frequency circuit.

7. A phonograph pickup unit of the variable capacity type for high-frequency oscillator modulation, comprising an outer conductive shield casing adapted for mounting in a tone arm structure for phonograph record reproducing apparatus and the like, an elongated insulating body carried by said casing, a movable stylus connected with and depending from a portion of the casing, a fixed electrode carried by and depending from said insulating body in relatively closely spaced capacitive relation to the stylus, a high-frequency inductive winding directly connected with said stylus and fixed electrode to provide therewith a tunable high frequency circuit subject to modulation control of said stylus, and means providing loose inductive output coupling with said winding.

8. A phonograph pickup unit as defined in claim 7, wherein a depending multiple-strand elongated brush element is carried by said unit and terminates at its lower end in a relatively large surface area in and at an angle to the plane of the stylus point on a record surface resiliently to effect damping of undesired resonances in said tone arm structure and to reduce the stylus pressure on said record surface.

9. A phonograph record pickup unit as defined in claim 7, wherein the portion of the casing to which the stylus is connected is removable with the stylus as a unit.

10. A phonograph pickup unit of the variable capacity type for high frequency oscillator modulation, comprising an outer conductive shield casing adapted for mounting in a tone arm structure, an elongated insulating body carried by said casing, a thin-walled straight tubular stylus depending from and rigidly connected with a portion of the casing, said stylus having a rigid beam section and two relatively shorter flat integral hinge sections between said beam section and the casing connection, a body of damping material engaging said hinge sections and the casing, a fixed insulated electrode depending from the insulating body in relatively closely spaced capacitive relation to the beam portion of the stylus, a high frequency inductive winding carried by the body and directly connected with said stylus and fixed electrode to provide therewith a tunable high frequency circuit subject to modulation control of said stylus, and low impedance inductive coupling means for said winding providing an output connection for said unit.

11. A phonograph pickup unit as defined in claim 10, wherein a depending multiple-strand elongated brush element is carried by said unit and has a lower free end of relatively large area adapted resiliently to engage a record surface at an angle to effect damping of undesired resonances in said tone arm structure and to reduce the stylus pressure on said record surface.

12. A phonograph pickup unit as defined in claim 10, wherein the portion of the casing to which the stylus is connected is removable with the stylus and damping body as a unit.

References Cited in the file of this patent

UNITED STATES PATENTS

| | | |
|---|---|---|
| 1,959,423 | Harrison | May 22, 1934 |
| 2,481,886 | Sinnett | Sept. 13, 1949 |
| 2,507,188 | Weathers | May 9, 1950 |
| 2,511,663 | Bachman | June 13, 1950 |